United States Patent
Cicili

(10) Patent No.: US 12,476,598 B2
(45) Date of Patent: Nov. 18, 2025

(54) INTRINSIC MOS CASCODE DIFFERENTIAL INPUT PAIR

(71) Applicant: pSemi Corporation, San Diego, CA (US)

(72) Inventor: Rogelio Cicili, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 365 days.

(21) Appl. No.: 18/160,546

(22) Filed: Jan. 27, 2023

(65) Prior Publication Data

US 2024/0258979 A1    Aug. 1, 2024

(51) Int. Cl.
*H03F 3/45* (2006.01)
*H03F 1/22* (2006.01)

(52) U.S. Cl.
CPC ......... *H03F 3/45188* (2013.01); *H03F 1/223* (2013.01); *H03F 3/45273* (2013.01)

(58) Field of Classification Search
CPC .. H03F 3/45188; H03F 1/223; H03F 3/45273; H03F 1/0283; H03F 2200/513; H03F 2203/45406; H03F 1/0266; H03F 3/45677
USPC ....................................................... 330/253
See application file for complete search history.

(56) References Cited

U.S. PATENT DOCUMENTS

| | | |
|---|---|---|
| 4,136,532 A | 1/1979 | Okuda |
| 4,550,284 A | 10/1985 | Sooch |
| 4,583,037 A | 4/1986 | Sooch |
| 5,612,614 A | 3/1997 | Barrett, Jr. et al. |
| 5,952,884 A | 9/1999 | Ide |
| 5,982,206 A | 11/1999 | Tachio et al. |

(Continued)

FOREIGN PATENT DOCUMENTS

| | | |
|---|---|---|
| CN | 108183691 A | 6/2018 |
| CN | 114911302 A | 8/2022 |

(Continued)

OTHER PUBLICATIONS

International Search Report and Written Opinion for Int'l Application No. PCT/US2024/012733 filed Jan. 24, 2024 on behalf of pSemi Corporation, Mail Date: May 17, 2024 (15 pages).

(Continued)

*Primary Examiner* — Andrea Lindgren Baltzell
*Assistant Examiner* — Khiem D Nguyen
(74) *Attorney, Agent, or Firm* — Steinfl + Bruno LLP

(57) ABSTRACT

Methods and devices for a cascode differential input pair with low headroom voltage and high output impedance are presented. The cascode differential input pair includes first and second input (cascode) stages, each including a common-source regular transistor in series connection with a common-gate intrinsic transistor. Sources of the regular transistors are tied, and gates of the intrinsic transistors are tied. A gate voltage to the intrinsic transistors is provided by a source voltage at the sources of the regular transistors, the source voltage based on a common mode input voltage of the cascode differential input pair. According to one aspect, the cascode differential input pair is part of a differential amplifier that includes a current source coupled to the sources of the regular transistors, and a load coupled to drains of the intrinsic transistors.

21 Claims, 9 Drawing Sheets

(56) References Cited

U.S. PATENT DOCUMENTS

| | | | |
|---|---|---|---|
| 6,066,944 A * | 5/2000 | Sakurai | H03F 3/505 |
| | | | 327/543 |
| 6,169,456 B1 | 1/2001 | Pauls | |
| 6,528,981 B1 | 3/2003 | Tsubaki | |
| 6,680,605 B2 | 1/2004 | Chen et al. | |
| 6,998,907 B1 | 2/2006 | Kindt et al. | |
| 7,724,077 B2 | 5/2010 | Bien | |
| 7,859,243 B2 | 12/2010 | Lorenz | |
| 8,067,287 B2 | 11/2011 | Baumgartner | |
| 9,874,893 B2 | 1/2018 | Ciubotaru | |
| 10,496,121 B2 | 12/2019 | Wang | |
| 11,177,803 B2 | 11/2021 | Kaur et al. | |
| 11,966,247 B1 | 4/2024 | Cicili | |
| 2004/0056708 A1 | 3/2004 | Bedarida et al. | |
| 2007/0290740 A1 | 12/2007 | Jongsma | |
| 2010/0019806 A1 | 1/2010 | Bien | |

FOREIGN PATENT DOCUMENTS

| | | |
|---|---|---|
| JP | S52101345 U | 8/1977 |
| JP | S5572327 U | 5/1980 |

OTHER PUBLICATIONS

International Search Report and Written Opinion for Int'l Application No. PCT/US2024/012886 filed Jan. 25, 2024 on behalf of pSemi Corporation, Mail Date: May 15, 2024 (14 pages).

Reiner, Richard et al., "Multi-Stage Cascode in High-Voltage AlGaN/GaN-on-Si Technology," 2018 IEEE 6th Workshop on Wide Bandgap Power Devices and Applications (WIPDA), IEEE, Oct. 31, 2018, pp. 237-241, XP033468420. 5 pages.

Testa, L. et al., "A Bulk Controlled Temperature and Power Supply Independent CMOS Voltage Reference." Circuits and Systems and Taisa Conference, 2008. Newcas-Taisa 2008. Jun. 22, 2008, pp. 109-112, XP031312018. 4 pages.

Non-Final Office Action for U.S. Appl. No. 18/160,536, filed Jan. 27, 2023 on behalf of pSemi Corporation, Mail Date: Aug. 3, 2023 (13 pages).

Notice of Allowance for U.S. Appl. No. 18/160,536, filed Jan. 27, 2023 on behalf of Psemi Corporation, Mail Date: Dec. 29, 2023, 9 pages.

\* cited by examiner

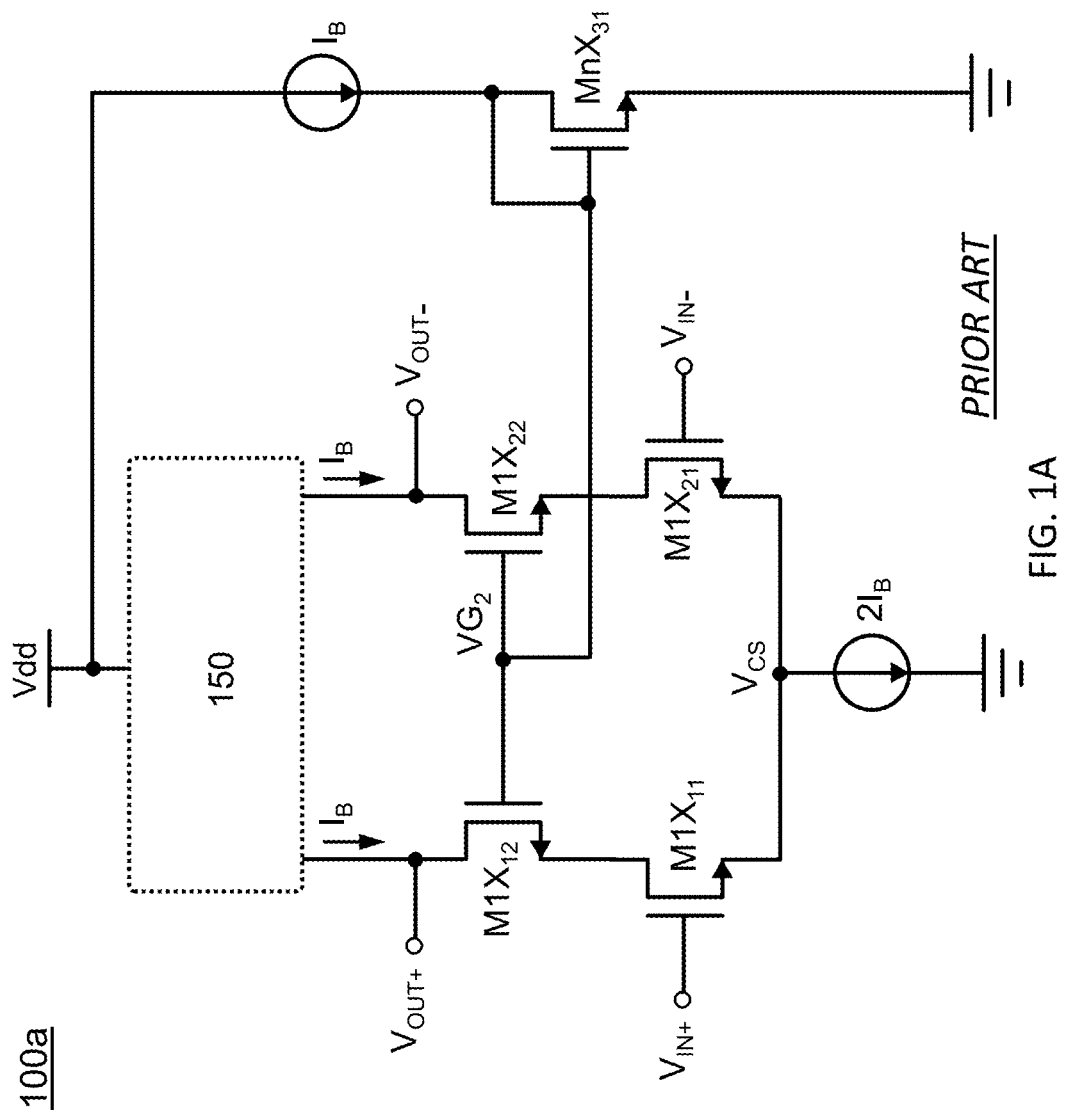
FIG. 1A  *PRIOR ART* ns, then the sources of the common-source transistors, $M1X_{11}$ and $M1X_{21}$, also increase. Accordingly, since
INTRINSIC MOS CASCODE DIFFERENTIAL INPUT PAIR

TECHNICAL FIELD

The present disclosure is related to electronic circuits, and more particularly to a cascode differential input pair having low headroom voltage requirement and high output impedance to enable a wide-swing output voltage.

BACKGROUND

An operational transconductance amplifier (OTA) may be used to perform the functions of differential amplification and differential-to-single-ended conversion. One shortcoming of such OTA is its voltage gain which may be limited to a gain provided by single basic MOS gain stage. An efficient technique to increase the voltage gain of an OTA may include increasing the output resistance of the OTA by a combination of an active cascode loading with a source-coupled cascode amplifier.

FIG. 1A shows a simplified schematic of a prior art differential amplifier (100a) that includes a cascode differential input pair ($M1X_{11}$, $M1X_{12}$, $M1X_{21}$, $M1X_{22}$) to convert a differential input voltage ($V_{IN+}$, $V_{IN-}$) to currents that, when conducted through a load (150), generate output voltages ($V_{OUT+}$, $V_{OUT-}$). The cascode differential input pair ($M1X_{11}$, $M1X_{12}$, $M1X_{21}$, $M1X_{22}$) includes a first cascode input stage ($M1X_{11}$, $M1X_{12}$, e.g., branch, leg) and a second cascode input stage ($M1X_{21}$, $M1X_{22}$), each such cascode input stage including a common-source (input) transistor (e.g., $M1X_{11}$, $M1X_{21}$, e.g., FETs) in series connection with a common-gate (output cascode) transistor (e.g., $M1X_{12}$, $M1X_{22}$, e.g., FETs). The common-gate transistors ($M1X_{12}$, $M1X_{22}$) may provide a higher output resistance of the first and second cascode input stages thereby increasing voltage gain of the differential amplifier (100a).

As shown in FIG. 1A, biasing of the common-gate transistors ($M1X_{12}$, $M1X_{22}$) of the prior art differential amplifier (100a) may be provided via an additional branch ($MnX_{31}$, $I_B$) that includes a current source, $I_B$, in series connection with a diode-connected transistor, $MnX_{31}$ (e.g., FET). By adequately selecting a size (e.g., ratio W/L of a width W to a length L) of the diode-connected transistor, $MnX_{31}$, relative to a size of the common-gate transistors ($M1X_{12}$, $M1X_{22}$), a self-established gate voltage, $VG_2$, for conduction of the current, $I_B$, through the diode-connected transistor, $MnX_{31}$, may promote conduction of the same current, $I_B$, through the common-gate transistors ($M1X_{12}$, $M1X_{22}$) when applied to gates of the latter as shown in FIG. 1A. A (DC) biasing current through the first and second cascode input stages, ($M1X_{11}$, $M1X_{12}$) and ($M1X_{21}$, $M1X_{22}$), may be provided by a current source (annotated in FIG. 1A as $2I_B$) coupled at a common source node (denoted $V_{CS}$) to the sources of the common-source (input) transistors ($M1X_{11}$, $M1X_{21}$).

Use of the additional branch ($MnX_{31}$, $I_B$) may be considered as a drawback since such branch may require a larger die area and higher power consumption of the prior art differential amplifier (100a). Furthermore, the prior art differential amplifier (100a) may include a reduced input common mode voltage range (CMVR) due to a fixed drain voltage and a varying source voltage of the common-source transistors, $M1X_{11}$ and $M1X_{21}$, wherein the fixed drain voltage is based on the gate voltage, $VG_2$, generated by the additional branch ($MnX_{31}$, $I_B$) and the varying source voltage is based on a common mode (input) voltage, $V_{CM}$, at gates of the common-source transistors, $M1X_{11}$ and $M1X_{21}$. Since the sources of the common-source transistors, $M1X_{11}$ and $M1X_{21}$, track the $V_{CM}$ voltage, as the $V_{CM}$ voltage increases, then the sources of the common-source transistors, $M1X_{11}$ and $M1X_{21}$, also increase. Accordingly, since the drains of the common-source transistors, $M1X_{11}$ and $M1X_{21}$, are at a fixed voltage (e.g., a sum of a threshold voltage and an overdrive voltage of the transistors) below the gate voltage, $VG_2$, then for increasing values of the $V_{CM}$ voltage, the drain-to-source voltages of the common-source transistors, $M1X_{11}$ and $M1X_{21}$, may decrease to potentially drive such transistors out of their respective saturation regions of operation that may be required for a performance of the differential amplifier (100a). It follows that a performance of the differential amplifier (100a) may be provided by limiting a high value of the $V_{CM}$ voltage, or in other words, by limiting/reducing the input common mode voltage range (CMVR) of the amplifier (as a low value of the $V_{CM}$ voltage is based on a headroom voltage required for operation of the current source $2I_B$).

FIG. 1B shows a simplified schematic of a prior art differential amplifier (100b) that overcomes the above described limited/reduced CMVR of the prior art differential amplifier (100a). In the configuration (100b), the source of the diode-connected transistor $MnX_{31}$ of the additional branch ($MnX_{31}$, $I_B$) is coupled to the sources of the common-source transistors, $M1X_{11}$ and $M1X_{21}$, at the common source node (denoted $V_{CS}$). Accordingly, the (self-established) gate voltage, $VG_2$, may track (e.g., varies along with) a variation of a voltage, $V_{CS}$, at the sources of the common-source transistors, $M1X_{11}$ and $M1X_{21}$. In turn, any variation (e.g., increase) of the voltage, $V_{CS}$, due to a variation (e.g., increase) of the common mode voltage, $V_{CM}$, may result in a corresponding variation (e.g., increase) of the gate voltage, $VG_2$. Accordingly, the drain-to-source voltages of the common-source transistors, $M1X_{11}$ and $M1X_{21}$, may remain fixed in view of a variation of the common mode voltage, $V_{CM}$, thereby maintaining such transistors in their respective saturation regions of operation.

Although the prior art configuration (100b) of FIG. 1B overcomes some of the shortcomings of the prior art configuration (100a) of FIG. 1A, it still requires an additional branch to generate the gate biasing voltage, $VG_2$.

The above prior art shortcomings are a basis for the teachings according to the present disclosure, including a cascode differential input pair that requires no additional bias generation branches, with a reduced headroom voltage requirement and high output impedance for a wide-swing output voltage.

SUMMARY

According to a first aspect of the present disclosure, a circuit is presented, comprising a cascode differential input pair comprising: a first input stage comprising a first common-source transistor in series connection with a first common-gate intrinsic transistor; and a second input stage comprising a second common-source transistor in series connection with a second common-gate intrinsic transistor, wherein sources of the first and second common-source transistors are connected at a common source node, gates of the first and second common-gate intrinsic transistors are connected at a common gate node, and the common source node is connected to the common gate node.

According to a second aspect of the present disclosure, a method for operating a cascode differential input pair with low headroom voltage is presented, the method comprising:

realizing a first input stage of the cascode differential input pair by series-connecting a first common-source transistor with a first common-gate intrinsic transistor; realizing a second input stage of the cascode differential input pair by series-connecting a second common-source transistor with a second common-gate intrinsic transistor; and biasing gates of the first and second common-gate intrinsic transistors with a voltage at a common source node that connects gates of the first and second common-source transistors.

Further aspects of the disclosure are provided in the description, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1A shows a simplified schematic of a prior art differential amplifier comprising a cascode differential input pair.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1B:
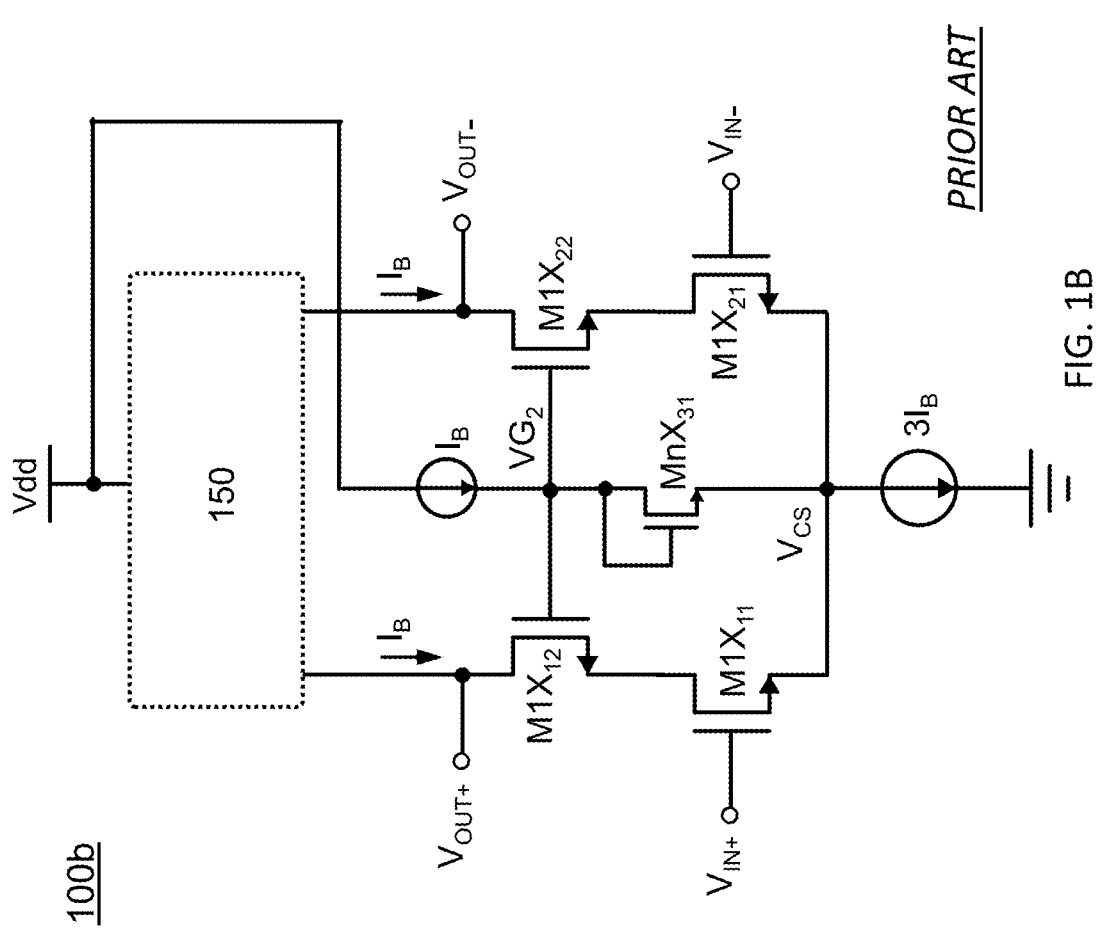
FIG. 1B shows a simplified schematic of another prior art differential amplifier comprising a cascode differential input pair.
Figure 1C:
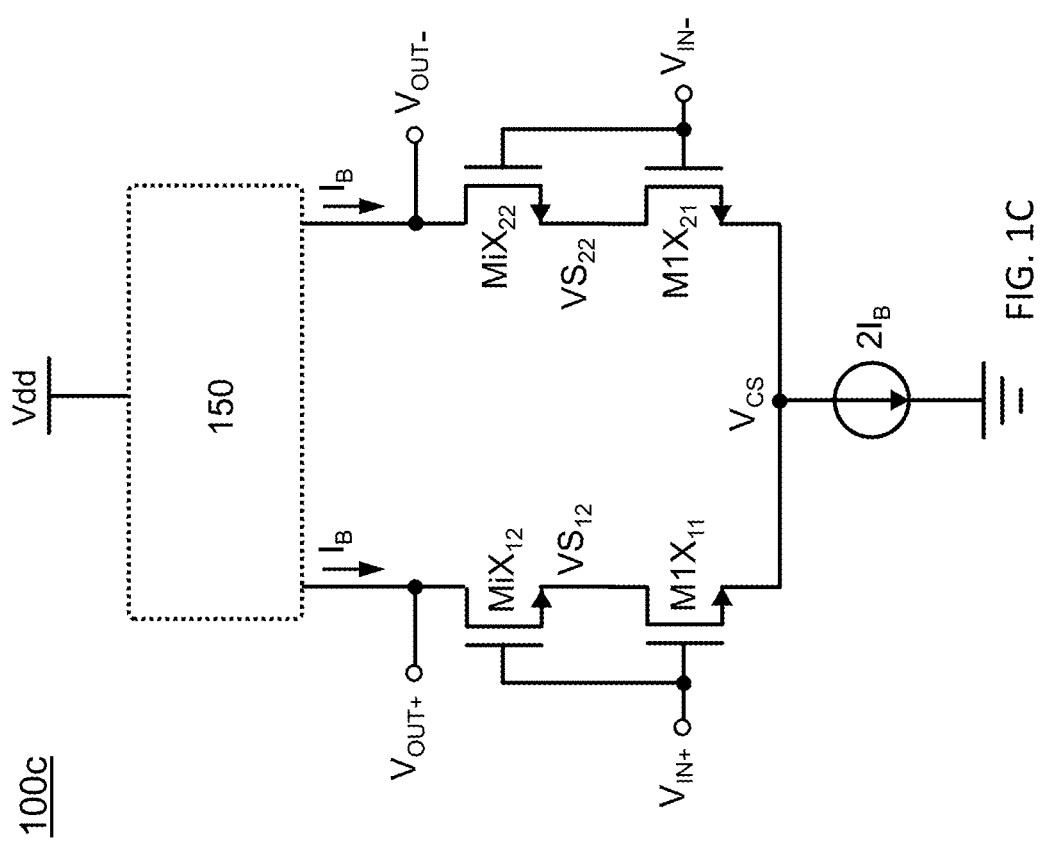
FIG. 1C shows a simplified schematic of a differential amplifier comprising a cascode differential input pair with intrinsic common gate transistors.

FIG. 1C shows a simplified schematic of a differential amplifier (100c) that includes a cascode differential input pair (M1X$_{11}$, M1X$_{12}$, M1X$_{21}$, M1X$_{22}$) which by virtue of using intrinsic (e.g., native) type transistors as the common-gate (output cascode) transistors (M1X$_{12}$, M1X$_{22}$) and regular type transistors as the common-source (input) transistors (M1X$_{11}$, M1X$_{21}$), allows transistors of each of the first and second input stage, (M1X$_{11}$, M1X$_{12}$) and (M1X$_{21}$, M1X$_{22}$), to be biased with a same gate voltage (e.g., common mode voltage V$_{CM}$), thereby removing requirement for an additional bias generation branch (e.g., MnX$_{31}$, I$_B$) as used in the configurations shown in FIG. 1A and FIG. 1B. Accordingly, as shown in FIG. 1C, the gate of the common-gate (intrinsic) transistor MiX$_{12}$ is connected to the gate of the common-source (regular) transistor M1X$_{11}$, and the gate of the common-gate (intrinsic) transistor MiX$_{22}$ is connected to the gate of the common-source (regular) transistor M1X$_{21}$.

Use of a same gate voltage for biasing of both transistors of each of the first and second input stage, (M1X$_{11}$, MiX$_{12}$) and (M1X$_{21}$, MiX$_{22}$), is made possible by selection of such transistors to include a "regular" transistor (e.g., M1X$_{11}$, M1X$_{21}$), having a size, W/L, provided by a ratio of its width (W) to its length (L), and an "intrinsic" or "native" transistor (e.g., MiX$_{12}$, MiX$_{22}$) of a same size. As used in the present disclosure, a regular transistor is a transistor having (regular) positive threshold voltage (V$_{th}$), and an intrinsic transistor is a transistor having a (strictly) negative and non-zero V$_{th}$ voltage, wherein the V$_{th}$ voltage is a gate-to-source voltage that puts the transistor at a limit between conduction and non-conduction. The V$_{th}$ of a regular (NMOS) FET may be approximately (positive) 500 millivolts or greater (e.g., 500 to 600 millivolts), and the V$_{th}$ of an intrinsic NMOS FET may be approximately negative 200 millivolts or less (i.e., more negative). In some embodiments according to the present disclosure, the V$_{th}$ of the intrinsic (NMOS) FETs may be in a range from negative 200 millivolts to negative 250 millivolts. It is noted that all the transistors used in the above-described configurations (100a) shown in FIG. 1A and (100b) of FIG. 1B are regular type transistors that accordingly require a positive threshold voltage, V$_{th}$.

Accordingly, a regular transistor (e.g., M1X$_{21}$) may operate in a corresponding saturation region for a gate-to-source voltage, Vgs, of about 600 millivolts that is equal to the sum of the (positive) V$_{th}$ voltage of the transistor (e.g., about 500 millivolts) and an overdrive voltage, V$_{OV}$, of the transistor (e.g., as low as about 100 millivolts). On the other hand, an intrinsic transistor (e.g., MiX$_{22}$) may operate in a corresponding saturation region for a gate-to-source voltage, Vgs, that is equal to the sum of the (negative) V$_{th}$ voltage of the transistor (e.g., about negative 200 millivolts or less) and an overdrive voltage, V$_{OV}$, of the transistor (e.g., as low as about 100 millivolts). Accordingly, such intrinsic transistor may operate in its saturation region for a gate-to-source voltage, Vgs, that is substantially less than 600 millivolts, such as for example, less than 150 millivolts and potentially extending into a negative voltage (depending on the negative value of the V$_{th}$ voltage). It is noted that, in some embodiments, a necessary condition for operation of a FET in its saturation region (and therefore provision of a high output impedance of the transistor) may be a drain-to-source voltage, Vds, that is greater than the overdrive voltage, V$_{OV}$, of the transistor (i.e., Vds>Vgs−V$_{th}$). In other words, a FET, either regular or intrinsic in the sense of the present disclosure, may operate in its saturation region for a Vds voltage that may be as low as about 100 millivolts.

With continued reference to FIG. 1C, because the same gate voltage (e.g., V$_{CM}$=(V$_{IN+}$+V$_{IN−}$)/2 present at both gates) is used for biasing of both transistors of each of the first and second input stage, (M1X$_{11}$, MiX$_{12}$) and (M1X$_{21}$, MiX$_{22}$), then a headroom voltage required for operation of such transistors in their respective saturation regions may be on the order of (V$_{th}$−V$_{thi}$)+Δ$_i$, where V$_{th}$ is a threshold voltage of a regular transistor (e.g., M1X$_{11}$, M1X$_{21}$); V$_{thi}$ is a (negative) threshold voltage of an intrinsic transistor (e.g., MiX$_{12}$, MiX$_{22}$); and Δ$_i$ is an overdrive voltage of an intrinsic transistor (e.g., MiX$_{12}$, MiX$_{22}$). Since V$_{th}$ may be about positive 500 millivolts, V$_{thi}$ may be about negative 200 millivolts, and Δ$_i$ may be about positive 100 millivolts, then the headroom voltage (e.g., between nodes denoted V$_{OUT+}$ and V$_{CS}$, or V$_{OUT-}$ and V$_{CS}$) may be greater than 750 millivolts, which may be considerable in low voltage applications (e.g., 1.2 volts and lower).

Furthermore, because the gates of the common-gate (intrinsic) transistors (MiX$_{12}$, MiX$_{22}$) may vary along with input (differential) voltages (V$_{IN+}$, V$_{IN-}$), then respective source voltages (VS$_{12}$, VS$_{22}$), and therefore drain voltages of the common-source transistors (M1X$_{11}$, M1X$_{21}$), may also vary along with the input voltages (V$_{IN+}$, V$_{IN-}$). Such input voltages (V$_{IN+}$, V$_{IN-}$) may vary (e.g., relative to V$_{CM}$) in opposite directions, for example, when V$_{IN+}$ increases, then V$_{IN-}$ decreases, and vice versa. Accordingly, since the sources of the common-source transistors (M1X$_{11}$, M1X$_{21}$) are tied, then the respective drain-to-source voltages of the common-source transistors (M1X$_{11}$, M1X$_{21}$) may vary in opposite directions, thereby generating differences in the respective drain-to-source voltages which may negatively affect performance of the cascode differential input pair (M1X$_{11}$, MiX$_{21}$, M1X$_{21}$, MiX$_{22}$) and therefore of the differential amplifier (100c) of FIG. 1C.

Figure 2:
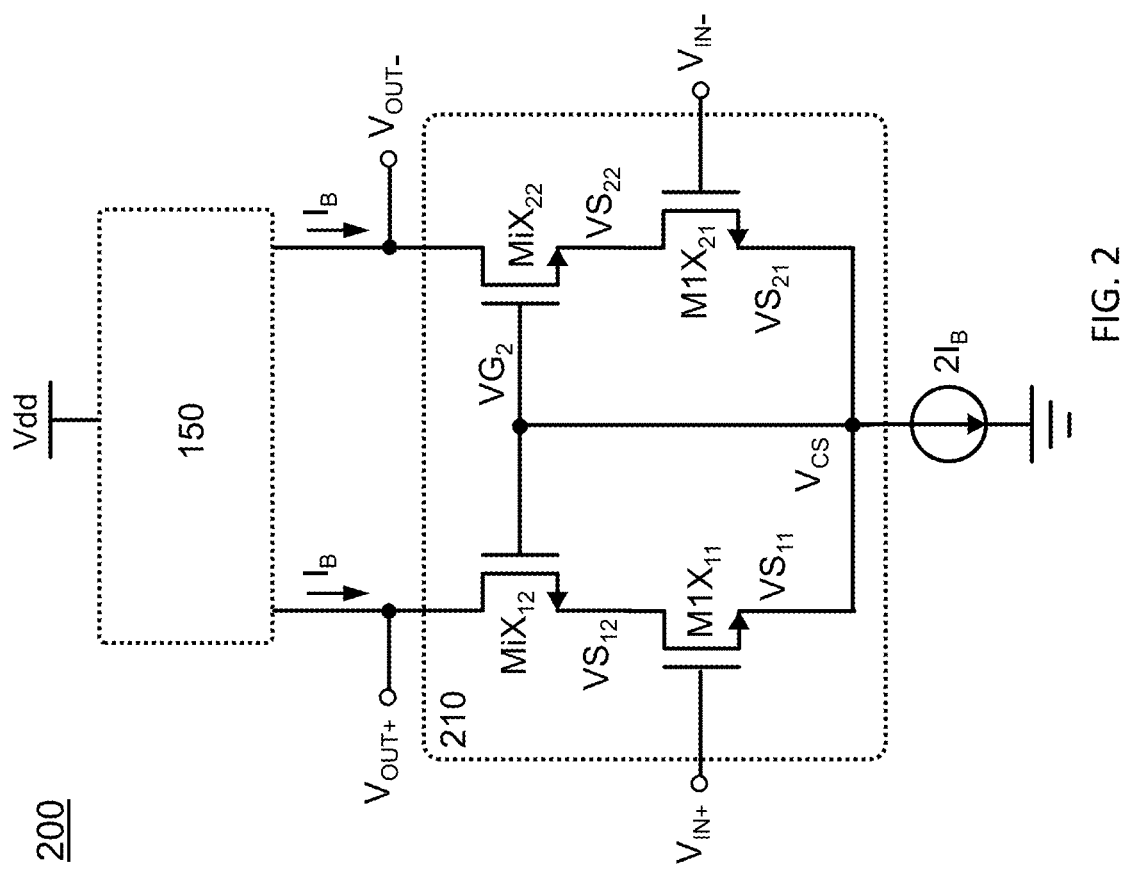
FIG. 2 shows a simplified schematic of a differential amplifier comprising a cascode differential input pair with intrinsic common gate transistors according to an embodiment of the present disclosure.

Teachings according to the present disclosure overcome the shortcoming of the configurations (100a) and (100b) described above with reference to FIG. 1A and FIG. 1B, as well as the shortcomings of the configuration (100c) of FIG. 1C. A cascode differential input pair (210) according to the present disclosure is shown in FIG. 2. The cascode differential input pair (210) may operate at a reduced headroom voltage that is on the order of two overdrive voltages (e.g., sum of the overdrive voltages, Δ and Δ$_i$, of a regular transistor and an intrinsic transistor, or about 200 millivolts), provide equal drain-to-source voltages for both common-source transistors (e.g., M1X$_{11}$, M1X$_{21}$) that (equally) track variations of the common mode (input) voltage V$_{CM}$, provide biasing of the common-gate (intrinsic) transistors via an internally generated voltage (e.g., V$_{CS}$) without use of any additional bias generation branches, provide increased output impedance/resistance and wide-swing output voltage (e.g., increased output voltage dynamic range).

FIG. 2 shows a simplified schematic of a differential amplifier (200) comprising a cascode differential input pair (210) with intrinsic common gate transistors (MiX$_{12}$, MiX$_{22}$) according to an embodiment of the present disclosure. The cascode differential input pair (210) includes first and second input stages, (M1X$_{11}$, MiX$_{12}$) and (M1X$_{21}$, MiX$_{22}$), each stage including a common-source (input) transistor (M1X$_{11}$, M1X$_{12}$) in series connection with a corresponding common-gate (output cascode) transistor (MiX$_{12}$, MiX$_{22}$). The common-gate transistors (M1X$_{12}$, M1X$_{22}$) may provide a higher output resistance of the first and second cascode input stages thereby increasing voltage gain of the differential amplifier (200).

As shown in FIG. 2, the cascode differential input pair (210) may convert a differential input voltage (V$_{IN+}$, V$_{IN-}$) to currents that, when conducted through a load (150), generate output voltages (V$_{OUT+}$, V$_{OUT-}$). The load (150) may include any passive load (e.g., resistors) or active load (e.g., including transistors, current mirrors), including any cascode current mirror described in the above referenced U.S. application, the disclosure of which is incorporated herein by reference in its entirety. Some examples of load circuits are described with reference to FIGS. 4-6 later described. A (DC) current through the first and second cascode input stages, (M1X$_{11}$, MiX$_{12}$) and (M1X$_{21}$, MiX$_{22}$), may be provided by a current source (annotated in FIG. 2 as 2I$_B$) coupled at a common source node (denoted V$_{CS}$) to the sources of the common-source (input) transistors (M1X$_{11}$, M1X$_{21}$). Due to the symmetry in the legs (M1X$_{11}$, MiX$_{12}$) and (M1X$_{21}$, MiX$_{22}$), a same current, I$_B$, may flow through each such leg.

A biasing voltage to gates of the common-source transistors (M1X$_{11}$, M1X$_{12}$) of FIG. 2 may be provided by a DC voltage coupled to the gates of (M1X$_{11}$, M1X$_{12}$), such as, for example, a common mode (input) voltage, V$_{CM}$ (e.g., (V$_{IN+}$+V$_{IN-}$)/2 present at both gates). Accordingly, a voltage V$_{CS}$ at the common source node (annotated as V$_{CS}$ in FIG. 2) may be equal to a voltage that is a gate-to-source voltage, Vgs, required for conduction of the current I$_B$ through each of the common-source transistors (M1X$_{11}$, M1X$_{12}$), below the common mode (input) voltage V$_{CM}$. It is noted that since the transistors (M1X$_{11}$, M1X$_{12}$) are regular type transistors that may be matched (e.g., same current-voltage characteristics and size), then for an equal value of the Vgs voltages of such transistors, a current that flows through one of the transistors (e.g., M1X$_{11}$) may be (exactly) equal to a current (e.g., I$_B$) that flows through the other transistor (e.g., M1X$_{12}$).

As shown in FIG. 2, the voltage V$_{CS}$ at the common source node (annotated as V$_{CS}$ in FIG. 2) that ties the sources of the common-source (regular) transistors (M1X$_{11}$, M1X$_{12}$) is used as biasing voltage (e.g., gate voltage VG$_2$) to gates of the common-gate (intrinsic) transistors (MiX$_{12}$, MiX$_{22}$). In other words, the sources of the common-source transistors (M1X$_{11}$, M1X$_{21}$) are connected (tied, directly coupled) to the gates of the common-gate (intrinsic) transistors (MiX$_{12}$, MiX$_{22}$). In turn, any variation (e.g., increase or decrease) of the voltage, V$_{CS}$, due to a variation (e.g., increase or decrease) of the common-mode voltage at the gates of the common-source transistors (M1X$_{11}$, M1X$_{12}$) may result in a corresponding variation of the gate voltage, VG$_2$, and therefore of the source voltages (VS$_{12}$, VS$_{22}$) of the common-gate (intrinsic) transistors (MiX$_{12}$, MiX$_{22}$). Because the sources of the common-gate transistors (MiX$_{12}$, MiX$_{22}$) are connected to the drains of the respective common-source transistors (M1X$_{11}$, M1X$_{21}$), it follows that the drain-to-source voltages, Vds, of the common-source transistors (M1X$_{11}$, M1X$_{21}$) may remain fixed in view of a variation of the common-mode voltage at the gates of the common-source transistors (M1X$_{11}$, M1X$_{12}$), thereby maintaining such transistors in their respective saturation regions of operation.

Furthermore, because the common-gate transistors (MiX$_{12}$, MiX$_{22}$) of FIG. 2 are intrinsic, and therefore include a negative V$_{th}$, then the voltages (VS$_{12}$, VS$_{22}$), and therefore the drain voltages of the common-source transistors (M1X$_{11}$, M1X$_{21}$), may be larger than the voltage VG$_2$, and therefore of the sources voltages of the common-source transistors (M1X$_{11}$, M1X$_{21}$), which may allow a sufficiently large and positive Vds voltage for operation of the transistors (M1X$_{11}$, M2X$_{12}$) in their respective saturation regions of operation.

For example, assuming that the threshold voltage, V$_{th}$, and the overdrive voltage, V$_{OV}$, of the intrinsic transistors (MiX$_{12}$, MiX$_{22}$) is respectively about negative 220 millivolts and positive 100 millivolts, then since the Vds of the regular transistors (M1X$_{11}$, M1X$_{21}$) is equal to −(V$_{th}$+V$_{OV}$) which is about positive 150 millivolts, and therefore sufficiently high for operation of the regular transistors (M1X$_{11}$, M1X$_{21}$) is their respective saturation modes of operation. It follows that the configuration (200) of FIG. 2 may allow for a lower headroom voltage of operation (e.g., about two overdrive voltages) that is comparable, for example, to the headroom voltage described above with reference to the configurations (100a) and (100b) of FIG. 1A and FIG. 1B. In turn, such low headroom voltage of operation may allow operation of the differential amplifier (200) from a supply voltage, Vdd, that is as low as 1.2 volts or lower.

It is noted that, in some embodiments, use of the intrinsic transistors (MiX$_{12}$, MiX$_{22}$) as cascode transistors in the cascode differential input pair (210) of FIG. 2 may be considered as a necessary condition for operation of said input pair, which in turn allows use of a (low) voltage V$_{CS}$ at the tied sources of the regular transistors (M1X$_{11}$, M1X$_{21}$) for biasing of the gate of the cascode transistors (MiX$_{12}$, MiX$_{22}$), which in turn allows operation (in saturation) of each of the input stages, (M1X$_{11}$, MiX$_{12}$) and (M1X$_{21}$, MiX$_{22}$), of the cascode differential input pair (210) at a low headroom voltage that is about two times the overdrive voltage of the transistors (e.g., headroom voltages in a range from 200-250 millivolts).

With continued reference to FIG. 2, the transistors shown in FIG. 2 may be designed for operation according to desired/specific parameter values, including, for example, currents (e.g., I$_B$) and threshold/overdrive voltages. Such parameter values may further be in view of a required operation of the common-source transistors in their respective saturation regions. Relationships between (drain) current (I$_D$), threshold voltage (V$_{th}$), gate-to-source voltage (V$_{gs}$), overdrive voltage (Δ), transistor width (W), and transistor length (L) of a FET are provided by the following (general) equations (1), (2), (3), (4) and (5):

$$I_D = \frac{K'}{2}\frac{W}{L}\Delta^2 \qquad \text{Equation (1)}$$

$$\Delta = V_{gs} - V_{th} = \sqrt{\frac{2I_D}{K'\frac{W}{L}}} \qquad \text{Equation (2)}$$

$$V_{IN+} = V_{cm} + \frac{v_d}{2} \qquad \text{Equation (3)}$$

$$V_{IN-} = V_{cm} - \frac{v_d}{2} \qquad \text{Equation (4)}$$

$$v_d = V_{IN+} - V_{IN-} \qquad \text{Equation (5)}$$

$$V_{cm} = \frac{V_{IN+} + V_{IN-}}{2} \qquad \text{Equation (6)}$$

wherein K and K' are well established FET process parameters, and v$_d$ is the differential (ac) input voltage.

Accordingly, applying the above equations to nodes carrying the voltages V$_{CS}$, VG$_2$, VS$_{12}$ and VS$_{22}$ shown in FIG. 2, the following equations (7) and (8) are obtained:

$$V_{CS} = V_{cm} - (V_{th} + \Delta) \qquad \text{Equation (7)}$$

$$VS_{12} = VS_{22} = V_{CS} - (V_{thi} + \Delta_i) \qquad \text{Equation (8)}$$

wherein:
V$_{th}$ denotes the threshold voltage of the regular transistors,
Δ denotes the overdrive voltage of the regular transistors,
V$_{thi}$ denotes the threshold voltage of the intrinsic transistors, and
Δ$_i$ denotes the overdrive voltage of the intrinsic transistors.

As previously described in the present application, in some embodiments, a necessary condition for maintaining a FET in its saturation region of operation may be expressed as: Vds>Vgs−V$_{th}$. According, considering the common-source (regular) transistors (M1X$_{11}$, M1X$_{21}$) of FIG. 2, since Vds=(VS$_{12}$− V$_{CS}$)=(VS$_{22}$−V$_{CS}$), then, when applied to the above equations (7)-(8), the following inequality (9) is obtained:

$$-(V_{thi} + \Delta_i) > \Delta \qquad (9)$$

which establishes a relationship between the overdrive voltage (Δ) of the common-source regular transistors (e.g., M1X$_{12}$, M1X$_{21}$) and the overdrive voltage (Δ$_i$) and threshold voltage (V$_{thi}$) of the intrinsic transistors (e.g., MiX$_{12}$, MiX$_{22}$), for (proper) operation of the cascode differential input pair (210) of FIG. 2. In other words, by fabricating/designing the regular transistors (e.g., M1X$_{11}$, M1X$_{21}$) and the intrinsic transistors (e.g., MiX$_{12}$, MiX$_{22}$) to include threshold/overdrive voltages according to the inequality (9), operation of each of the transistors (M1X$_{11}$, MiX$_{12}$, M1X$_{21}$, MiX$_{22}$) in their respective saturation regions is expected.

Figure 3:
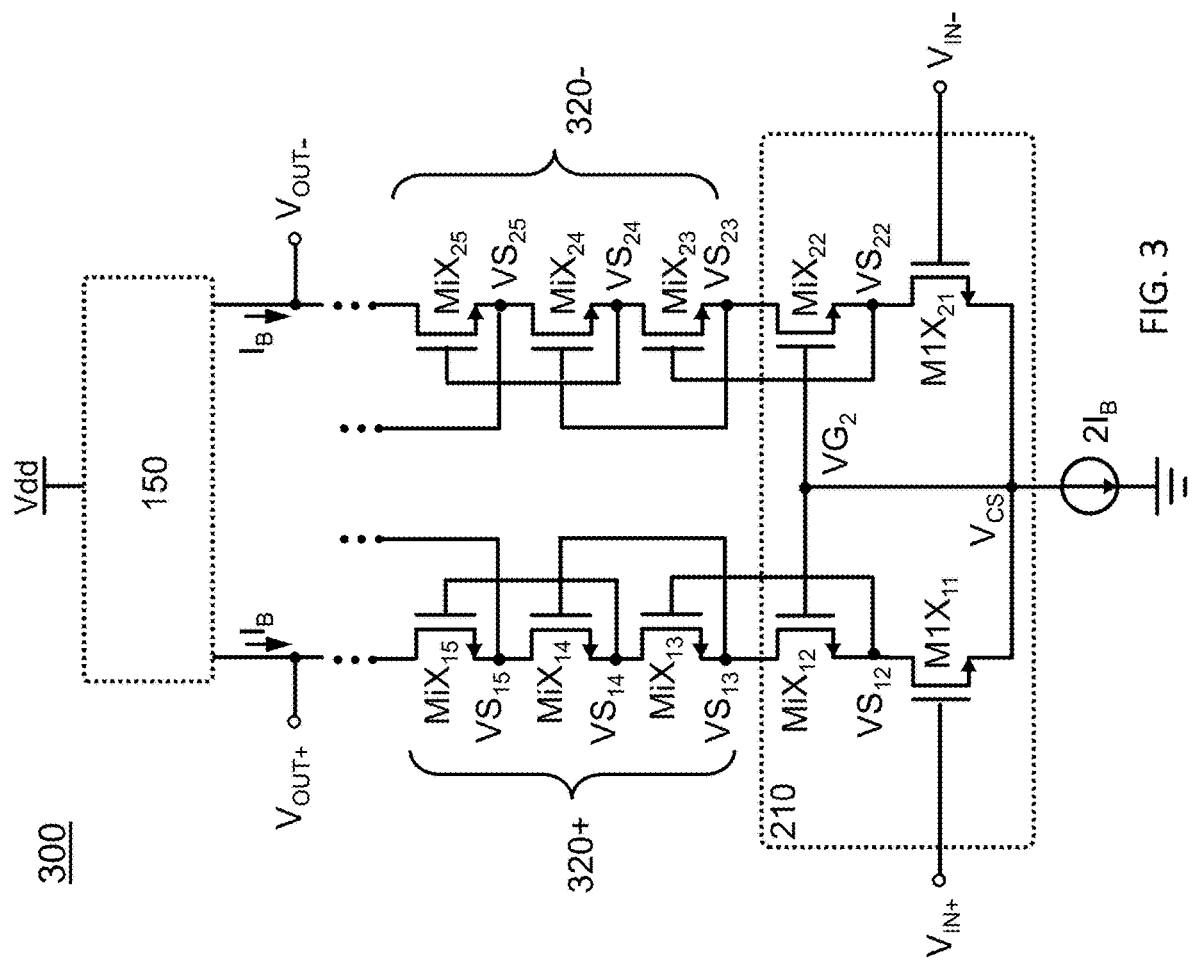
FIG. 3 shows a simplified schematic of a differential amplifier comprising a cascode differential input pair with intrinsic common gate transistors according to another embodiment of the present disclosure, the differential amplifier configured for a higher output voltage.

According to an embodiment of the present disclosure, increased voltage withstand capability at an output (e.g., V$_{OUT+}$, V$_{OUT-}$) of the cascode differential input pair (210) according to the present disclosure may be provided via one or more series-connected transistors that are configured to self-bias. This is shown in FIG. 3, wherein a respective self-biased stack, (320+) and (320−), including a respective one or more series-connected intrinsic transistors, (MiX$_{13}$, . . . MiX$_{15}$, . . . ) and (MiX$_{13}$, . . . , MiX$_{15}$, . . . ), is coupled (in series connection) to an output of a respective input stage, (M1X$_{11}$, MiX$_{12}$) and (M1X$_{21}$, MiX$_{21}$), of the cascode differential input pair (210). Accordingly, a (aggregate Vds, e.g., 100-150 millivolts per transistor) voltage drop across the self-biased stack (320+, 320−) may allow for a higher voltage to couple to each of the input stages, (M1X$_{11}$, MiX$_{12}$) and (M1X$_{21}$, MiX$_{21}$), including a voltage that is higher than a technology rating voltage (e.g., withstand voltage) of the transistors (M1X$_{11}$, MiX$_{12}$, M1X$_{21}$, MiX$_{21}$). Because the stacks (320+, 320−) are self-biased, no additional biasing voltages may need to be generated. It should be noted that although FIG. 3 shows the self-biased stacks (320+, 320−) separate from the cascode differential input pair (210), partitioning of circuits may be arbitrary as one may envision a cascode differential input pair (210, 320+, 320−) having embedded self-biased stacks (320+, 320−) for a high voltage withstand capability. In such case, each of the input stages of the cascode differential input pair (210, 320+, 320−) may be represented by transistors (M1X$_{11}$, MiX$_{12}$, MiX$_{13}$, . . . , MiX$_{15}$, . . . ) and (M1X$_{21}$, MiX$_{22}$, MiX$_{23}$, . . . , MiX$_{25}$, . . . ).

As shown in FIG. 3, self-biasing of a transistor of the one or more series-connected intrinsic transistors of the self-biased stacks (320+, 320−) may be provided by coupling a gate of the transistor to a source of an adjacent transistor whose drain is connected (e.g., directly coupled) to a source of the transistor. For example, considering the intrinsic transistor MiX$_{15}$ whose source is connected to the drain of the adjacent (intrinsic) transistor MiX$_{14}$, then self-biasing of the intrinsic transistor MiX$_{15}$ may be provided by connecting its gate to the source of the adjacent (intrinsic) transistor MiX$_{14}$. Because the self-biasing is provided by coupling the gates of the transistors to voltages that are smaller than voltages at the respective sources of the transistors, use of intrinsic transistors may be considered as a necessary condition for operation of the self-biased stacks (320+, 320−) in some example embodiments.

According to an example embodiment of the present disclosure, the one or more series-connected intrinsic transistors, (MiX$_{13}$, . . . , MiX$_{15}$, . . . ) and (MiX$_{13}$, . . . , MiX$_{15}$, . . . ), of the self-biased stacks, (320+) and (320−), may advantageously include source-body tied transistor devices that include bodies that are tied to the respective sources. Some advantages obtained by such source-body tied transistor device may include increased stability of the threshold voltage (V$_{th}$) of the device and therefore provide for a more stable self-biasing scheme. (Also, the source-body tied configuration may be necessary for transistors operating above the maximum voltage capability in some example embodiments. This is because tying the bodies to ground would result in drain/source junction breakdown as those voltages rise above the maximum voltage capability.

As described above in the present disclosure, output voltages (V$_{OUT+}$, V$_{OUT-}$) of the differential amplifier according to the present teachings may be provided by coupling a load (150) to the (differential) output of the cascode differential input pair (e.g., 210 of FIG. 2 or 210 of FIG. 3 through 320+ and 320−), a high side of the load coupled to a supply voltage, Vdd.

Figure 4:
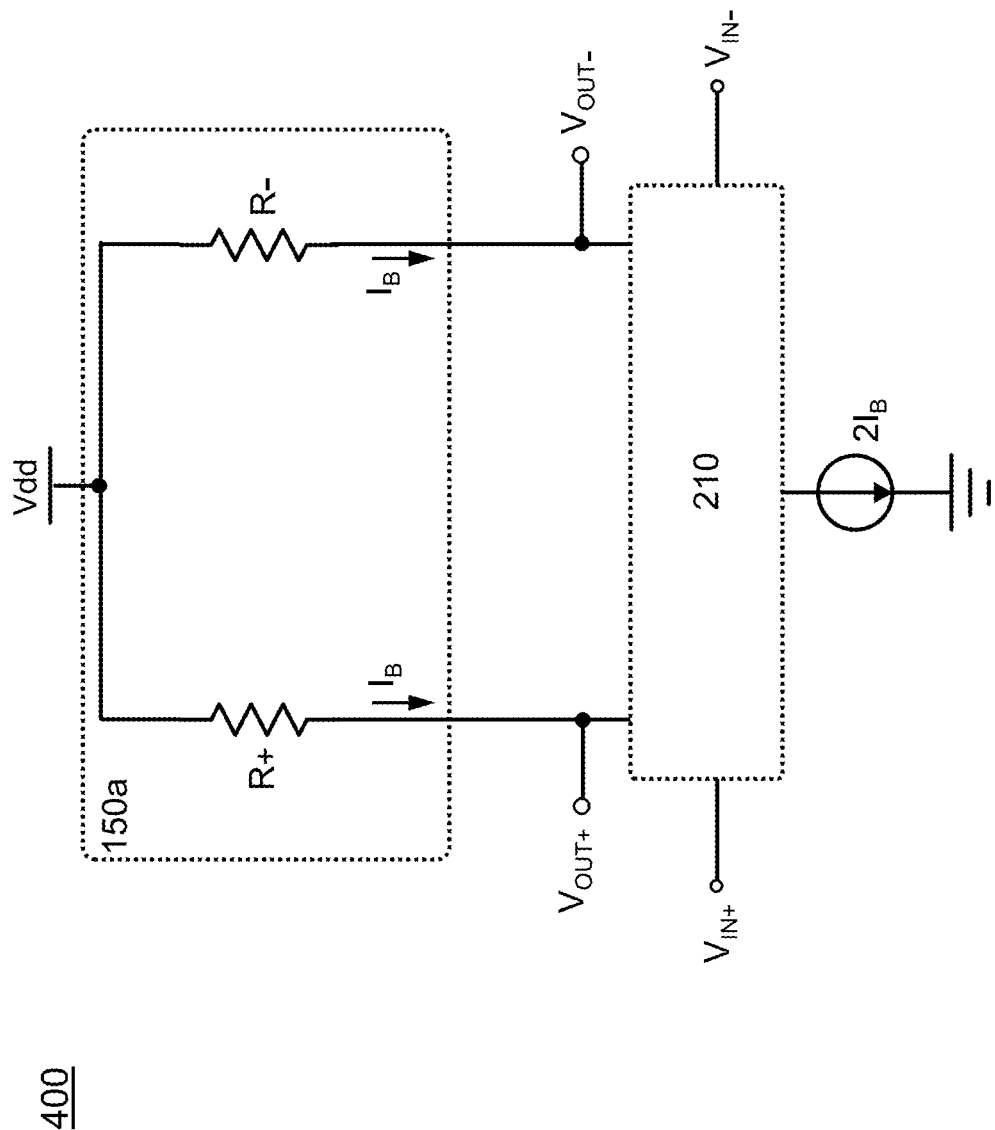
FIG. 4 shows a simplified schematic of a passive load circuit coupled to the cascode differential input pair of FIG. 2.

As shown in FIG. 4, the load may be a passive load (150a, a passive load circuit) that includes two resistive branches indicated in FIG. 4 as R+ and R−. It will be appreciated that, each such resistive branch, R+ or R−, may be coupled to a respective one of the first input stage (e.g., M1X$_{11}$, MiX$_{12}$ of FIG. 2) or the second input stage (e.g., M1X$_{21}$, MiX$_{22}$ of FIG. 2) of the cascode differential input pair (210).

Figure 5:
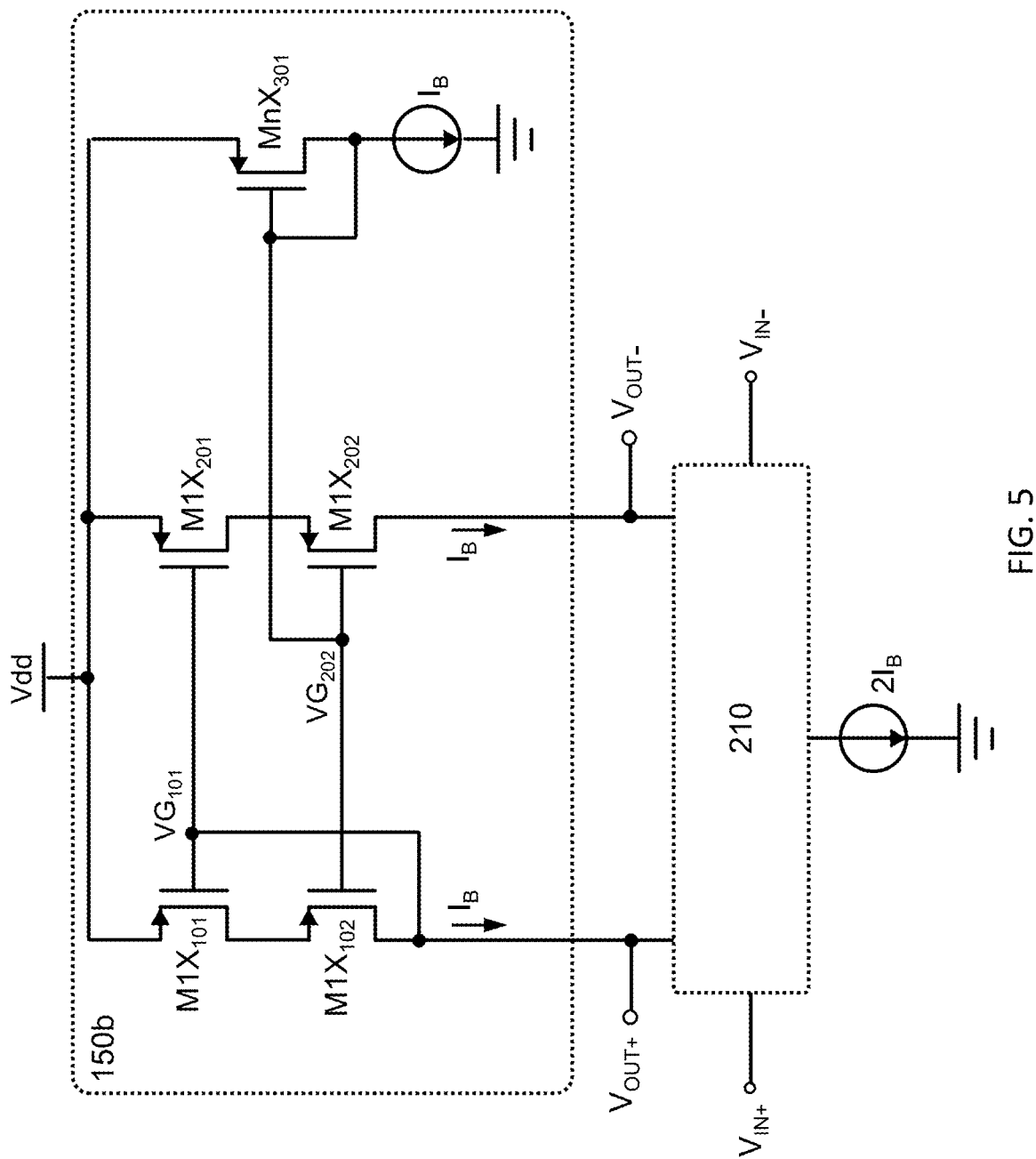
FIG. 5 shows a simplified schematic of an active load circuit coupled to the cascode differential input pair of FIG. 2.

As shown in FIG. 5, the load may be an active load (150b, an active load circuit) that includes a cascode current mirror (e.g., 150b) having a first leg (M1X$_{101}$, M1X$_{102}$) and a second leg (M1X$_{201}$, M1X$_{202}$) that mirrors a current through the first leg. Each leg includes a common-source transistor (M1X$_{101}$, M1X$_{201}$) in series connection with a common-gate (cascode) transistor (M1X$_{102}$, M1X$_{202}$), the latter transistor providing an increased output impedance/resistance of the leg. Because the output impedance/resistance of each leg of the current mirror (e.g., 150b) combines (in parallel) with an output impedance/resistance of the corresponding first or second input stage of the cascode differential input pair (210), it may be desirable to maintain a higher output impedance of the each leg (e.g., by providing the cascode transistors M1X$_{102}$, M1X$_{202}$) so as to maintain a higher combined output impedance at the output nodes that carry the output voltage (V$_{OUT+}$, V$_{OUT-}$). An additional biasing branch, (MnX$_{301}$, I$_B$), that includes a current source, I$_B$, in series connection with a diode-connected transistor, MnX$_{301}$ (e.g., FET), may be used to generate a gate biasing voltage, VG$_{202}$, for the common-gate (cascode) transistor (M1X$_{102}$, M1X$_{202}$) in a manner similar to one described above with reference to generation of the gate biasing voltage, VG$_2$, of FIG. 1A. It should be noted that the transistors (e.g., M1X$_{101}$, M1X$_{102}$, M1X$_{201}$, M1X$_{202}$, MnX$_{301}$) shown in the current mirror (150b, active load) may be of a complementary/opposite type to transistors (e.g., M1X$_{11}$, MiX$_{12}$, M1X$_{21}$, MiX$_{22}$) of the cascode differential input pair (210). In particular, the transistors (e.g., M1X$_{11}$, MiX$_{12}$, M1X$_{21}$, MiX$_{22}$) of the cascode differential input pair (210) may be n-type FETs, and the transistors (e.g., M1X$_{101}$, M1X$_{102}$, M1X$_{201}$, M1X$_{202}$, MnX$_{301}$) of the current mirror (150b) may be p-type FETs.

Figure 6:
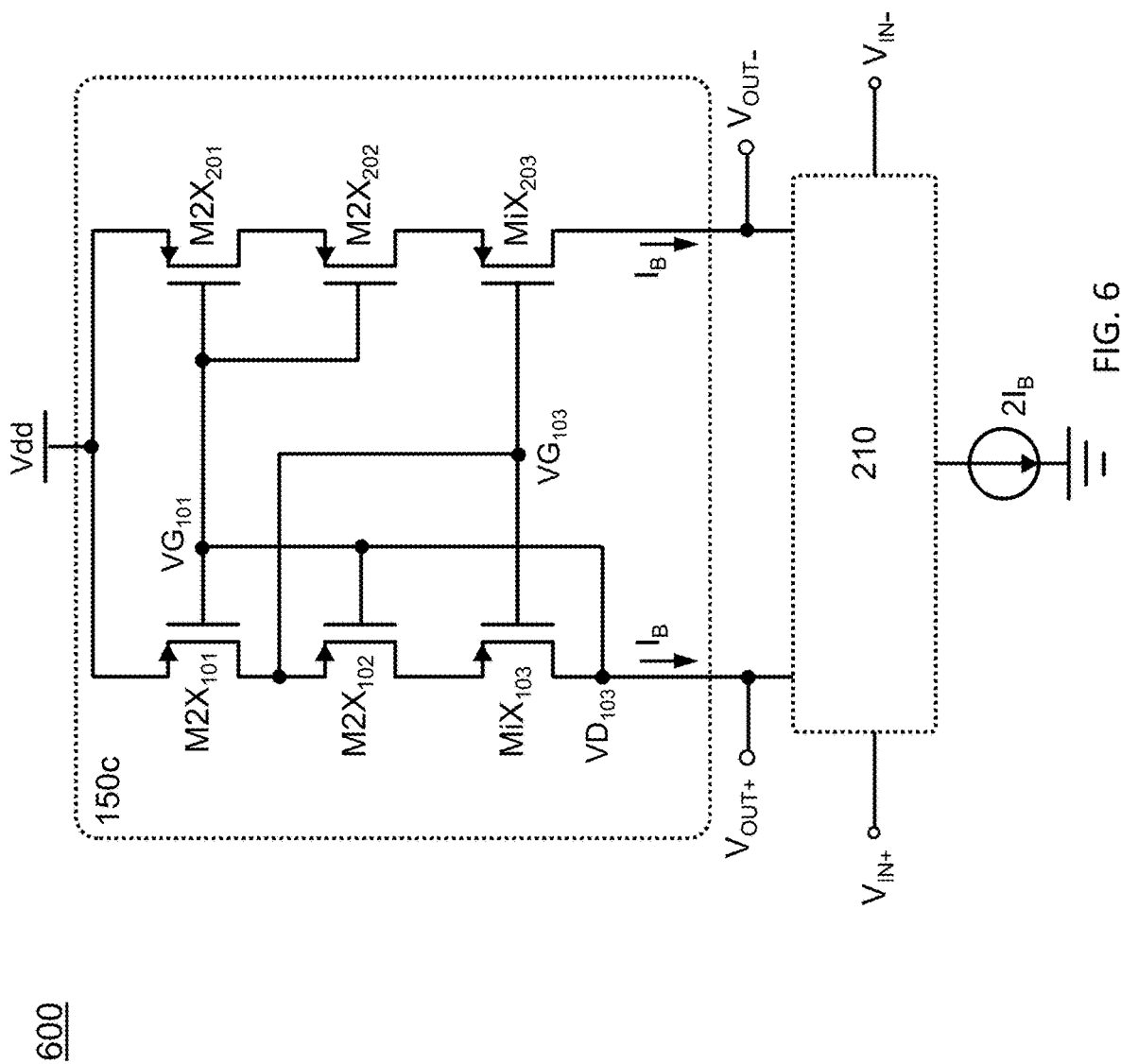
FIG. 6 shows a simplified schematic of another active load circuit coupled to the cascode differential input pair of FIG. 2.

FIG. 6 shows a simplified schematic of another active load (150c, active load circuit) coupled to the cascode differential input pair (210) of FIG. 2. It is noted that a full description of the active load (150c) is provided in the above referenced U.S. application, the disclosure of which is incorporated herein by reference in its entirety. As described in said U.S. application, the active load (150c) is a wide-swing cascode current mirror with low headroom voltage and high output impedance. An input leg (M2X$_{101}$, M2X$_{102}$, MiX$_{103}$) of the current mirror (150c) includes a composite transistor (M2X$_{101}$, M2X$_{102}$) in series connection with an intrinsic transistor MiX$_{103}$. The composite transistor (M2X$_{101}$, M2X$_{102}$) includes two series-connected regular transistors, M2X$_{101}$, and M2X$_{102}$, with respective sizes that are twice the size of the intrinsic transistor MiX$_{103}$. An output leg (M2X$_{201}$, M2X$_{202}$, MiX$_{203}$) of the current mirror (150c) includes a composite transistor (M2X$_{201}$, M2X$_{202}$) in series connection with an intrinsic transistor MiX$_{203}$.

With continued reference to FIG. 6, gates of the two series-connected regular transistors, M2X$_{101}$ and M2X$_{102}$, of the input leg (M2X$_{101}$, M2X$_{102}$, MiX$_{103}$) are connected to the drain of the intrinsic transistor MiX$_{103}$. Accordingly, a gate voltage, VG$_{101}$, of the composite transistor, provided at a node that is common to gates of the two series-connected regular transistors, M2X$_{101}$ and M2X$_{102}$, self-establishes when a reference current (e.g., I$_B$) flows through the input leg (M2X$_{101}$, M2X$_{102}$, MiX$_{103}$). The self-established gate voltage, VG$_{101}$, is used to bias the composite transistor (M2X$_{201}$, M2X$_{202}$) of the output leg (M2X$_{201}$, M2X$_{202}$, MiX$_{203}$). A biasing voltage, VG$_{103}$, to the (common, tied, connected) gates of the intrinsic transistors, MiX$_{103}$ and MiX$_{203}$, is provided by an intermediate node that provides the series connection of the regular transistors, M2X$_{101}$, and M2X$_{102}$, of the composite transistor (M2X$_{101}$, M2X$_{102}$). In other words, the biasing voltage, VG$_{103}$, is provided at the intermediate node of the composite transistor (M2X$_{101}$, M2X$_{102}$) that ties the drain of the regular transistor M2X$_{101}$ to the source of the regular transistor M2X$_{102}$. In some embodiments, the composite transistor (M2X$_{201}$, M2X$_{202}$) may be a single regular transistor of size 1× (as opposed to the 2× size of the constituent transistors of the composite transistor). Furthermore, the transistors (e.g., M1X$_{11}$, MiX$_{12}$, M1X$_{21}$, MiX$_{22}$) of the cascode differential input pair (210) may be n-type FETs, and the transistors (e.g., M1X$_{101}$, M1X$_{102}$, MiX$_{103}$, M1X$_{201}$, M1X$_{202}$, MiX$_{203}$) of the current mirror (150c) may be p-type FETs As shown in FIG. 6, the gates of the transistors M2X$_{101}$ and M2X$_{102}$ are connected to one another, and a drain of the transistor M2X$_{101}$ is connected to a source of the transistor M2X$_{102}$. Accordingly, the composite transistor (M2X$_{101}$, M2X$_{102}$) may include a source that is provided by a source of the transistor M2X$_{101}$, a drain that is provided by a drain of the transistor M2X$_{102}$, and a gate that is provided by the common gates (e.g., node carrying voltage VG$_{101}$) of the transistors M2X$_{101}$ and M2X$_{102}$. Furthermore, because the composite transistor (M2X$_{101}$, M2X$_{102}$) may include a width, W$_{CMP}$, that is equal to a width, W$_2$, of each of the transistors M2X$_{101}$ and M2X$_{102}$, and a length, L$_{CMP}$, that is the sum of the lengths, L$_2$+L$_2$, of the transistors M2X$_{101}$ and M2X$_{102}$, then the size, W$_{CMP}$/L$_{CMP}$, of the composite transistor (M2X$_{101}$, M2X$_{102}$) may be equal to W$_2$/(L$_2$+L$_2$), or in other words, equal to half the size (2×) of each of the transistors M2X$_{101}$ and M2X$_{102}$, which is equal to the size (1×) of each of the transistors, MiX$_{103}$ and MiX$_{203}$. Same characteristics may apply to the composite transistor (M2X$_{201}$, M2X$_{202}$), which as described above, may be replaces by a single regular transistor of size 1×.

It should be noted that teachings according to the present disclosure may not be limited to a cascode differential input pair (e.g., 210 of FIGS. 2-6) having output nodes (e.g., nodes carrying output voltages $V_{OUT+}$, $V_{OUT+}$) configured to sink currents via n-type FET devices, rather, the present teachings equally apply to a cascode differential input pair having output nodes configured to source currents via p-type FET devices. Such p-type configuration may be considered a dual or complementary configuration to the n-type configuration described above.

Figure 7:
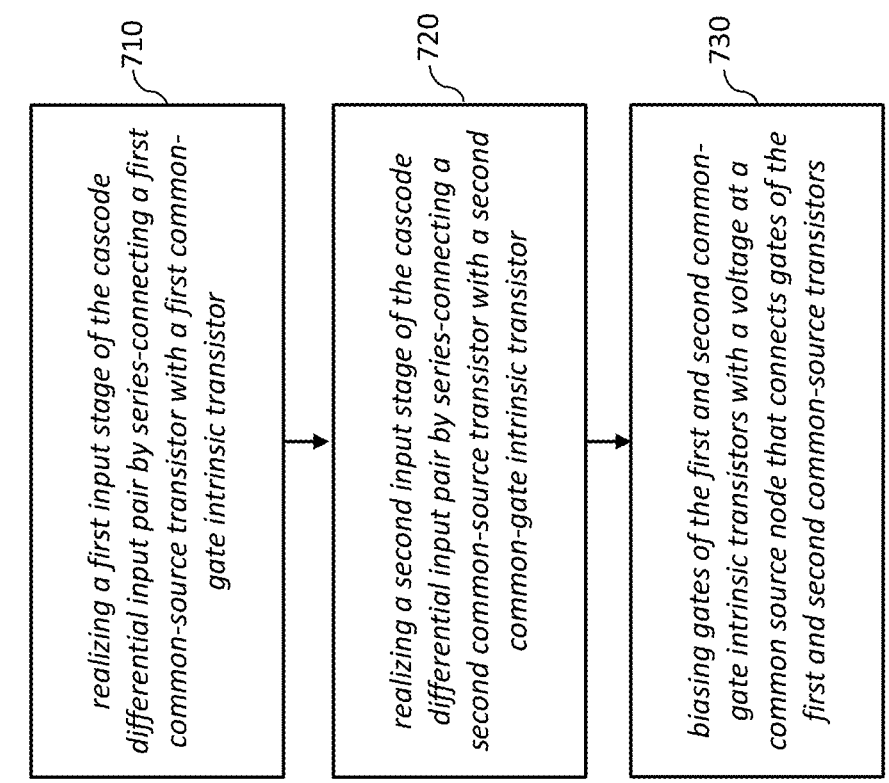
FIG. 7 is a process chart showing various steps of a method according to an embodiment of the present disclosure for operating a cascode differential input pair with low headroom voltage.

FIG. 7 is a process chart (700) showing various steps of a method for operating a cascode differential input pair with low headroom voltage. As can be seen in the process chart (500), the method comprises: realizing a first input stage of the cascode differential input pair by series-connecting a first common-source transistor with a first common-gate intrinsic transistor, per step (710), realizing a second input stage of the cascode differential input pair by series-connecting a second common-source transistor with a second common-gate intrinsic transistor, per step (720), and biasing gates of the first and second common-gate intrinsic transistors with a voltage at a common source node that connects gates of the first and second common-source transistors, per step (730).

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductor-field-effect-transistors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductor FETs, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure and are not intended to limit the scope of what the applicant considers to be the invention. Such embodiments may be, for example, used within mobile handsets for current communication systems (e.g., WCDMA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuit, comprising:
a cascode differential input pair comprising:
   a first input stage comprising a first common-source transistor in series connection with a first common-gate intrinsic transistor; and
   a second input stage comprising a second common-source transistor in series connection with a second common-gate intrinsic transistor,
   wherein
      sources of the first and second common-source transistors are connected at a common source node,
      gates of the first and second common-gate intrinsic transistors are connected at a common gate node, and
      the common source node is directly connected to the common gate node.

2. The circuit according to claim 1, wherein during operation of the cascode differential input pair:
a voltage at the common source node is based on a common mode input voltage at a differential input of the cascode differential input pair, the differential input provided by gates of the first and second common-source transistors.

3. The circuit according to claim 1, wherein during operation of the cascode differential input pair:
a voltage at the common source node is equal to a voltage that is a gate-to-source voltage of the first and second common-source transistors below a common mode input voltage at a differential input of the cascode differential input pair.

4. The circuit according to claim 1, wherein during operation of the cascode differential input pair:
a voltage at a respective source of the first and second common-gate transistors is greater than a voltage at the common gate node.

5. The circuit according to claim 1, wherein:
ratios between respective widths and lengths of the first and second common-source transistors and the first and second common-gate intrinsic transistors are equal.

6. The circuit according to claim 1, wherein during operation of the cascode differential input pair:
a difference between
   a voltage at a respective drain of the first and the second common-source transistors, and
   a voltage at the common source node,
is greater than an overdrive voltage of the respective first and the second common-source transistors, so as to operate the first and the second common-source transistors in their respective saturation regions.

7. The circuit according to claim 1, wherein:
the first common-source transistor and the second common-source transistor comprise respective positive threshold voltages, and
the first common-gate intrinsic transistor and the second common-gate intrinsic transistor comprise respective negative threshold voltages.

8. The circuit according to claim 7, wherein:
the respective negative threshold voltages are in a range from negative 200 millivolts to negative 250 millivolts.

9. The circuit according to claim 8, wherein:
respective overdrive voltages of the first and second common-source transistors and of the first and second common-gate transistors are equal to about positive 100 millivolts.

10. The circuit according to claim 1, further comprising:
a current source coupled between the common source node and a reference ground; and
a load circuit coupled between a supply voltage and a differential output of the cascode differential input pair.

11. The circuit according to claim 10, wherein:
the load circuit is a passive load that comprises first and second resistive branches respectively coupled to the first and second input stages.

12. The circuit according to claim 10, wherein:
the load circuit is an active load that comprises a cascode current mirror, the cascode current mirror comprising first and second legs respectively coupled to the first and second input stages.

13. The circuit according to claim 12, wherein:
each of the first and second legs comprises a respective common-source transistor in series connection with a respective common-gate transistor.

14. The circuit according to claim 13, wherein:
the respective common-gate transistors of the first and second legs are intrinsic transistors having gates connected to one another,
the respective common-source transistor of the first leg is a composite transistor comprising two series-connected transistors, and
an intermediate node that connects the two series-connected transistors is connected to the gates of the intrinsic transistors of the first and second legs.

15. The circuit according to claim 1, further comprising:
first and second self-biased stacks each comprising one or more series-connected intrinsic transistors, the first and second self-biased stacks respectively in series connection with the first and second common-gate intrinsic transistors,
wherein for each transistor of the one or more series-connected intrinsic transistors of the first and second self-biased stacks:
   a source node of the each transistor is connected to a drain node of an adjacent intrinsic transistor, and
   a gate node of the each transistor is connected to a source node of the adjacent intrinsic transistor.

16. The circuit according to claim 15, wherein:
each transistor of the one or more series-connected intrinsic transistors of the first and second self-biased stacks comprises a source-body tied transistor.

17. A method for operating a cascode differential input pair with low headroom voltage, the method comprising:
realizing a first input stage of the cascode differential input pair by series-connecting a first common-source transistor with a first common-gate intrinsic transistor;
realizing a second input stage of the cascode differential input pair by series-connecting a second common-source transistor with a second common-gate intrinsic transistor;
connecting sources of the first and second common-source transistors at a common source node; and
directly connecting gates of the first and second common-gate intrinsic transistors to the common source node, thereby biasing the gates of the first and second common-gate intrinsic transistors with a voltage at the common source node.

18. The method according to claim 17, wherein:
the voltage at the common source node is based on a common mode input voltage at a differential input of the cascode differential input pair, the differential input provided by gates of the first and second common-source transistors.

19. The method according to claim 17, wherein:

the first common-source transistor and the second common-source transistor comprise respective positive threshold voltages, and the first common-gate intrinsic transistor and the second common-gate intrinsic transistor comprise respective negative threshold voltages.

20. The method according to claim 19, wherein:

the respective negative threshold voltages are in a range from negative 200 millivolts to negative 250 millivolts.

21. The method according to claim 20, wherein:

respective overdrive voltages of the first and second common-source transistors and of the first and second common-gate transistors are equal to about positive 100 millivolts.

* * * * *